United States Patent [19]
Edinger et al.

[11] Patent Number: 4,631,436
[45] Date of Patent: Dec. 23, 1986

[54] TRANSDUCER PLATE FOR PIEZOELECTRIC TRANSDUCERS

[75] Inventors: Egon Edinger, Krailling; Reinhart Schade, Olching, both of Fed. Rep. of Germany

[73] Assignee: Siemens Aktiengesellschaft, Berlin & Munich, Fed. Rep. of Germany

[21] Appl. No.: 630,890

[22] Filed: Jul. 13, 1984

[30] Foreign Application Priority Data

Sep. 29, 1983 [DE] Fed. Rep. of Germany ....... 3335431

[51] Int. Cl.$^4$ ............................................ H01L 41/08
[52] U.S. Cl. ...................................... 310/322; 310/324
[58] Field of Search ................ 310/322, 324, 330–332, 310/800; 179/110 A

[56] References Cited

U.S. PATENT DOCUMENTS

| | | | |
|---|---|---|---|
| 2,105,011 | 1/1938 | Williams | 310/332 |
| 2,479,926 | 8/1949 | Gravley | 310/332 |
| 3,084,228 | 4/1963 | Shiga | 310/332 X |
| 3,153,156 | 10/1964 | Watlington | 310/332 |
| 4,240,002 | 12/1980 | Tosi et al. | 310/324 |
| 4,475,014 | 10/1984 | King | 310/322 X |
| 4,496,871 | 1/1985 | Sumita et al. | 310/324 |

*Primary Examiner*—Mark O. Budd
*Attorney, Agent, or Firm*—Hill, Van Santen, Steadman & Simpson

[57] ABSTRACT

A transducer plate comprises electrically-conductive material on both sides and carries a respective piezoceramic on each side which has a respective electrode. The piezoceramics are electrically connected in parallel and are connected to the transducer plate via a respective, insulating adhesive layer. For the purpose of contacting the two inner electrodes, a passage is provided in the transducer plate and a connector ribbon is located between the adhesive layer and the inner electrode of one side and extends through the passage 2 to a position between the inner electrode and the adhesive layer of the other side. Only a single connector ribbon is therefore required for the pressure contacting of the two inner electrodes. Apparatus for threading the connector ribbon through the passage comprises bed dies having guide channels for the connector ribbon, whereby the connector ribbon is threaded through the passage either by way of a hob extruding die or by way of a curved-shaped surface of a guide channel.

7 Claims, 3 Drawing Figures

TRANSDUCER PLATE FOR PIEZOELECTRIC TRANSDUCERS

BACKGROUND OF THE INVENTION

1. Field of the Invention

The present invention relates to a transducer plate for piezoelectric transducers, particularly for transducers of the type for use in receivers in telephone systems, and which consists of electrically conductive material whose two sides carry piezoceramic and electrodes, the piezoceramic being applied by way of an electrically-insulating adhesive layer, and to apparatus for manufacturing such a transducer plate.

2. Description of the Prior Art

Transducer plates for piezoelectric transducers, particularly for receivers in telephone systems, are usually held clamped in the region of their edges between bearing members and are connected to a piezoceramic which is provided with electrodes at both sides, whereby the electrical speed to the electrode of the piezoceramic can be produced via ribbon connectors or the like.

Such transducer plates are known from various publications.

The German published application No. 31 07 344 and the German published application No. 31 07 293, both incorporated herein by this reference, disclose a transducer plate held clamp in its edge region by bearing members.

The connection between a transducer plate consisting of electrically-conductive material and the piezoceramic provided with electrodes on both sides can occur with an electrically-insulating adhesive layer under the influence of heat and pressure. It is known from the German published application No. 28 20 403, fully incorporated herein by this reference, to thereby contact the inner electrode of the piezoceramic at the adhesive side by way of a ribbon connector which is somewhat thinner than the adhesive layer and is placed on the adhesive layer before the application of the piezoceramic.

Piezoelectric transducers belong to the group of reversible transducers, i.e. they can be electrically excited and emit sound or vice-versa. These transducers can thus be versatility employed. They can therefore be utilized as transmitters, earphones or as acoustic signal generators in telephone systems. Depending upon its utilization, the transducer must be specifically matched to the requirements of, for example, an earphone (receiver), i.e. an amplifier must be provided under given conditions or the resonator spaces and the sound conducting channel must be matched to the respective use.

A transducer capacitance of about 200 nF is required given the use of piezoelectric transducers as telephone receivers in order to achieved the necessary voltage response, since the telephone receiver is therewith matched to the telephone. Two solutions have been disclosed for the realization thereof. The one solution consists of the use of a very thin ceramic having a mean dielectric constant of $\epsilon=1500$, while the other solution consists of the use of a mean ceramic thickness of about 100 $\mu$m with a higher dielectric constant of $\epsilon=4000$. The former solution can lead to problems in the automatic bonding of the thin ceramic. The second solution requires a high dielectric constant, which results in a higher temperature dependency of the ceramic.

In order to keep the temperature dependency of the transducer negligibly small, without requiring an all too thin ceramic layer, it has already been proposed in-house of the assignee of the present invention, that a respective piezoceramic be provided with electrodes on both sides and be applied to the transducer plate and that the two piezoceramics be electrically connected in parallel.

SUMMARY OF THE INVENTION

Given a transducer plate comprising piezoceramics applied to both sides, the object of the present invention is to contact the two inner electrodes in a reliable manner and with the lowest possible expense.

Given a transducer plate of the type initially set forth, the above object is achieved, according to the present invention, in that the transducer plate is provided with a passage whose area remains free of the insulating adhesive layers and through which a connecting ribbon disposed between an adhesive layer and an inner electrode of one side is conducted out to the other side between the other adhesive layer and the inner electrode of the other side. The advantage is achieved in practicing the present invention, in particular, that the two inner electrodes can be contacted with the assistance of a single ribbon connector and, therefore, a fourth ribbon connector can be eliminated.

Given a preferred embodiment of the invention, the two piezoceramics provided with electrodes from both sides are disposed on the transducer plate lying opposite one another and the passage is introduced into the transducer plate in the region of the piezoceramics. A particular, symmetrical arrangement of the two piezoceramics is thereby obtained.

According to a further preferred feature of the invention, the connector ribbon is conducted toward the outside at that side of the transducer plate which lies opposite a peripheral burr formed when the plate is punched from stock. A short between the connector ribbon and the peripheral burr of the plate is therefore certain to be excluded.

The present invention also provides advantageous apparatus for threading a connector ribbon through the passage of a transducer plate provided with insulating adhesive layers on both sides.

A first embodiment of such an apparatus is characterized by:
- a bed die emplaceable on the transducer plate in the region of the passage;
- a guide channel for the connector ribbon which traverses the passage and is introduced into the bearing surface of the bed die; and
- a hob extruding punch guided in the bed die and which is displaceable through the guide channel and the passage.

A connector ribbon can then be inserted in a simple manner into the guide group of the bed die and be threaded through the passage of the transducer plate by way of a corresponding stroke of the hob extruding punch.

A second embodiment of such an apparatus is characterized by:
- a bed die which can be emplaced on the transducer plate in the region of the passage; and
- a guide channel for the connector ribbon which is introduced into the bearing surface of the bed die and leads in a curved manner into the passage.

Given the second embodiment, the connector ribbon is likewise inserted into the guide channel of the bed die and is thereby steered directly into the passage by way of a curve-like course of the guide channel. It is thereby advantageous when a cooperating die can be pressed against the other side of the transducer plate in the region of the passage is additionally provided, a further guide channel for the connector ribbon which leads back from the passage to the transducer plate, also in a curve-like course, is thus introduced into the bearing surface of the cooperating die.

It is particularly beneficial given both embodiments of the apparatus when the connector ribbon can be introduced into the guide channel of the bed die by way of a feed apparatus.

According to a further feature of the apparatus of the invention, a cutter for cutting the connector ribbon can be initiated when the bed die lifts from the transducer plate.

It has also proven particularly beneficial for a rational production sequence when the transducer plate provided with the insulating adhesive layer on both sides can be positioned in a receptacle of a rotary indexing table and grooves aligning to the guide channel cfthe bed die are introduced into the upper side of the receptacle and rotary indexing table. Other work steps required for the manufacture of the transducer plate can then be simultaneously executed at further stations of a corresponding rotary indexing table during the threading operation.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
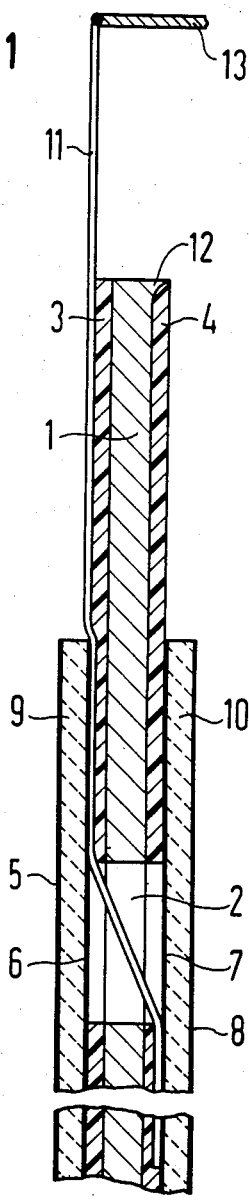
FIG. 1 is a fragmentary sectional view of a transducer plate for piezoelectric transducers having a connector ribbon conducted through a passage.

Referring to FIG. 1, a passage 2 is introduced into a transducer plate 1 which consists of, for example, aluminum and which shall be referred to below as a membrane. An insulating adhesive layer 3, 4 is provided surface-wide on respective sides of the membrane 1. The insulating adhesive layers 3 and 4 are, for example, 60 μm + 10 μm thick, whereby a thermoplastic adhesive such as, for example, polyethyleneacrylic acid copolymerisate is employed as the material. A pair of piezoceramics 9 and 10 are provided with electrodes 5, 6, 7 and 8 and are applied on both sides of the membrane via the adhesive layers 3 and 4 by way of a pressing process given a simultaneous application of heat. The electrodes 5, 6, 7 and 8 are a matter of, for example, thin layers of silver fired into the piezoceramics 9 and 10. The outer electrodes 5 and 8 are contacted with the assistance of copper connecting ribbons by way of soldering, the copper connecting ribbons not being illustrated on the drawing. The inner electrodes 6 and 7 are contacted such that a connecthg ribbon 11 of copper is applied on the one side between the inner electrode 7 and the adhesive layer 4 before the pressing operation for bonding the piezoceramics 9 and 10, and is fed through the passage to and conducted out at the other side between the adhesive layer 3 and the inner electrode 6. During the pressing operation for bonding the piezoceramics 9 and 10, the connecting ribbon 11 is then pressure-contacted to the two inner electrodes 6 and 7.

The advantages of the described arrangement lie in the central production of the two pressure contacts, whereby the fact that this operation can be automated should be particularly emphasized. Further, only a single connecting ribbon 11 need be supplied for contacting the two electrodes 6 and 7 on the adhesive side. The connecting ribbon is carried out at that side of the membrane 1 which is provided with the adhesive layers 3 and 4 which lies opposite the punch burr 12 which arose when a punching base circular membrane 1. The hazard of a short circuit between the connecting ribbon 11 and the punch burr 12 of the membrane 1 is thereby suppressed.

The outer end of the connecting ribbon 11 is electrically connected to a continuing component 13. The continuing component 13 is a matter of a solder lug, for example.

Figure 2:
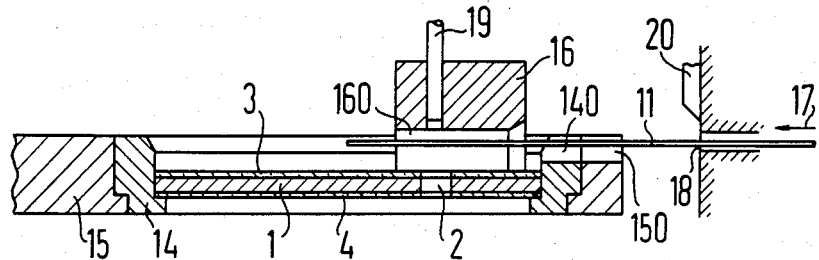
FIG. 2 is a sectional view of a first exemplary embodiment of an apparatus for threading a connector ribbon through the passage of the transducer plate illustrated in FIG. 1.

FIG. 2 illustrates a first apparatus for threading a connecting ribbon 11 through the passage 2 of the membrane 1 provided with insulating adhesive layers 3 and 4 on both sides thereof. The membrane 1 is thereby positioned in a receptacle 14 of a rotary indexing table 15.

A bed die 16 is located above the region of the passage 2 in the membrane 1, a guide channel 160 having been introduced into the lower bearing surface of the bed die 16. When the bed die 16 is now placed on the adhesive layer 3 of the membrane 1 by way of a corresponding downward stroke, a nearly through guide channel, which is only slightly wider than the connecting ribbon 11, arises by way of the guide channel 160 and, aligned therewith, grooves 140 or, respectively 150 located in the receptacle 14 and the rotary indexing table 15. The connecting ribbon 11 is then pushed through an opening 18 into the grooves 150 and 140 and into the guide channel 160 by way of a feed device, symbolically indicated by an arrow 17, to such an extent that it traverses the passage 2. A circular cylindrical hob extruding die 19, which is guided in the bed die 16, is subsequently moved down, whereby the connecting ribbon 11 is threaded through the passage 2. The stroke of the hob extruding die or punch 19 is thereby dimensioned such that the inner end of the connecting ribbon 11 springs up and rests against the lower adhesive layer 4 of the membrane 1. At the same time as the return stroke of the hob extruding die 19 and of the bed die 16, the connecting ribbon 11 is cut to the required length by a cutter 20. 20.

Figure 3:
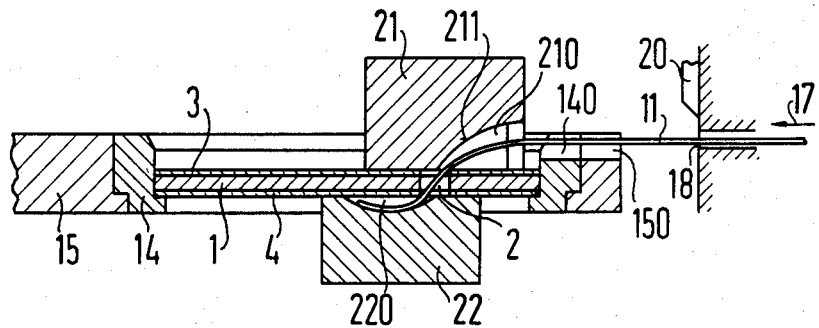
FIG. 3 is a sectional view of a second exemplary embodiment of an apparatus for threading a connector ribbon through the passage of the transducer plate illustrated in FIG. 1.

FIG. 3 illustrates a second apparatus for threading a connecting ribbon 11 through the passage 2 of the membrane 1 which is provided with the insulating adhesive layers 3 and 4 on respective sides thereof. Here, also, the membrane 1 is again positioned in the receptacle 14 of a rotary indexing table 15.

A bed die 21 into whose lower bearing surface a guide channel 21, including a downwardly-curved surface, is located above the region of the passage 2 in the membrane 1. When the bed die 21 is now placed against the adhesive layer 3 of the membrane 1 by way of a corresponding downward stroke, then a nearly through guide channel is performed which is only slightly wider than the connecting ribbon, as the result of the groove 140 and 150 and a guide channel 210 which carries the curved surface. The connecting ribbon 11 is then pushed through the opening 18 into the grooves 150 and 140 and into the guide channel 210 by way of a feed device, again indicated symbolically by the arrow 17. The connecting ribbon 11 is thereby steered directly into the passage 2 of the membrane 1 by way of the curved, burnished, groove bottom surface 211 of the guide channel 210. A cooperating die 22 is placed against the lower adhesive surface 4 below the membrane 1 in the region of the passage 2. A further guide channel 220 comprises a return bottom curve surface 221 and directs the distal end of the connecting ribbon 11 to the underside of the membrane 1. The connecting ribbon is again then cut to the required length by the cutter 20 at the same time as the return stroke of the bed die 21 and of the cooperating die 22.

The cooperating die 22 can also be rigidly disposed, i.e. it need not execute a stroke motion, when the rotary indexing table executes a vertical stroke before or, respectively, after its rotary motion. Given favorable relationships of the width of the connecting ribbon 11, the thickness of the membrane 1, the diameter of the passage 2 and the elasticity of the connecting ribbon 11, the cooperating die 22 can be entirely eliminated.

The apparatus illustrated in FIG. 3 is particularly well-suited for a rational and automated production. Particularly deriving as an advantage over the apparatus illustrated in FIG. 2 is that the hob extruding die is not required and, therefore, one less function need be executed.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a transducer of the type in which a transducer plate includes first and second sides, first and second electrically-insulating adhesive layers are carried on the first and second sides, and first and second piezoceramic elements, each carrying electrodes on both of its sides, mounted on respective adhesive layers, and in which the piezoceramic elements are connected in parallel via the electrodes, the improvement wherein:
   the transducer includes a passage extending therethrough from the first side to the second side; and
   an electrical conductor extending through said passage parallel to and electrically contacting the respective electrode of each of the piezoceramic elements between that electrode and the respective adhesive layer.

2. The improved transducer of claim 1, wherein: said electrical conductor is a flat ribbon conductor.

3. The improved transducer of claim 1, wherein the transducer plate includes an edge burr on the second side, and wherein:
   said conductor includes a section extending out of the transducer on the first side thereby preventing contact thereof by the burr.

4. A transducer plate device comprising:
   a planar membrane including opposed planar surfaces and a passage therethrough extending between said surfaces;
   a pair of electrically-insulating adhesive layers each carried on a respective surface of said membrane; and
   a conductor extending through said passage and including a pair of sections each of which is parallel to and engages a respective adhesive layer,
   whereby a pair of piezoceramic elements each having a pair of electrodes may be mounted on a respective adhesive layer with a respective electrode of each contacting said conductor.

5. The transducer plate device of claim 4, wherein: said conductor is a flat ribbon conductor.

6. A piezoelectric transducer comprising:
   a pair of piezoceramic plates each comprising opposite sides and first and second electrodes on said opposite sides;
   a membrane comprising opposite sides and a passage extending therebetween;
   a pair of non-conductive adhesive layers each carried on a respective side of said membrane and each securing a respective first electrode to said membrane; and
   a conductor extending through said passage and comprising respective sections located between, parallel to and contacting a respective adhesive layer and the electrode secured by that adhesive layer.

7. A piezoelectric transducer comprising:
   a pair of piezoceramic plates each comprising opposite sides and first and second electrodes on said opposite sides;
   a membrane comprising opposite sides, a passage extending therebetween and a peripheral burr on one of said sides;
   a pair of non-conductive adhesive layers each carried on a respective side of said membrane and each securing a respective first electrode to said membrane; and
   a conductor extending through said passage and comprising respective sections located between, parallel to and contacting a respective adhesive layer and the electrode secured by that adhesive layer, one of said sections extending beyond said membrane and out of said transducer on the side opposite said peripheral burr.

* * * * *